(12) United States Patent
Hebbale

(10) Patent No.: US 8,275,527 B2
(45) Date of Patent: Sep. 25, 2012

(54) METHOD OF MODELING TRANSMISSIONS FOR REAL-TIME SIMULATION

(75) Inventor: Kumaraswamy V. Hebbale, Troy, MI (US)

(73) Assignee: GM Global Technology Operations LLC

( * ) Notice: Subject to any disclaimer, the term of this patent is extended or adjusted under 35 U.S.C. 154(b) by 946 days.

(21) Appl. No.: 12/254,199

(22) Filed: Oct. 20, 2008

(65) Prior Publication Data

US 2010/0082311 A1   Apr. 1, 2010

Related U.S. Application Data

(60) Provisional application No. 61/101,842, filed on Oct. 1, 2008.

(51) Int. Cl.
  *G06F 7/00*  (2006.01)
  *G06F 17/00*  (2006.01)
  *G06F 19/00*  (2011.01)

(52) U.S. Cl. ........................... 701/51; 701/59

(58) Field of Classification Search .................... 700/29; 701/59; 703/6, 7, 8
See application file for complete search history.

(56) References Cited

U.S. PATENT DOCUMENTS

| 7,013,250 B2 * | 3/2006 | Hagiwara et al. ................ 703/8 |
| 2008/0182720 A1 * | 7/2008 | Kobayashi et al. ........... 477/175 |

\* cited by examiner

*Primary Examiner* — Mary Cheung
*Assistant Examiner* — Kyle K Tsui

(57) ABSTRACT

A transmission modeling system includes an in-gear module that determines an in-gear acceleration when a vehicle is in gear. A shift module determines a shift acceleration based on a clutch torque when the vehicle is shifting between gears. A shaft acceleration determination module determines a shaft acceleration based on at least one of the in-gear acceleration and the shift acceleration.

20 Claims, 6 Drawing Sheets

METHOD OF MODELING TRANSMISSIONS FOR REAL-TIME SIMULATION

CROSS-REFERENCE TO RELATED APPLICATIONS

This application claims the benefit of U.S. Provisional Application No. 61/101,842, filed on Oct. 1, 2008. The disclosure of the above application is incorporated herein by reference.

STATEMENT OF GOVERNMENT RIGHTS

This invention was made under a CRADA 0601001 between General Motors Corporation and UChicago Argonne LLC, and Argonne National Laboratory operated for the United States Department of Energy. The Government has certain rights in this invention.

FIELD

The present disclosure relates to vehicle modeling systems and methods, and more specifically to a transmission modeling system and method for real-time simulation.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Internal combustion engines combust an air and fuel mixture to generate drive torque. Transmissions typically increase the drive torque via clutches that engage different gears based on a desired transmission gear ratio. The transmission gear ratio may be selected based on several factors, including an accelerator pedal position, vehicle speed, vehicle mass, and road conditions.

Transmission models determine response characteristics of transmissions for real-time simulations of vehicles systems and development of control systems, such as an electronically controlled capacity clutch and a smart shift adaptive system. Transmission models may further determine response characteristic of transmissions for real-time evaluations of vehicles systems.

SUMMARY

A transmission modeling system includes an in-gear module that determines an in-gear acceleration when a vehicle is in gear. A shift module determines a shift acceleration based on a clutch torque when the vehicle is shifting between gears. A shaft acceleration determination module determines a shaft acceleration based on at least one of the in-gear acceleration and the shift acceleration.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
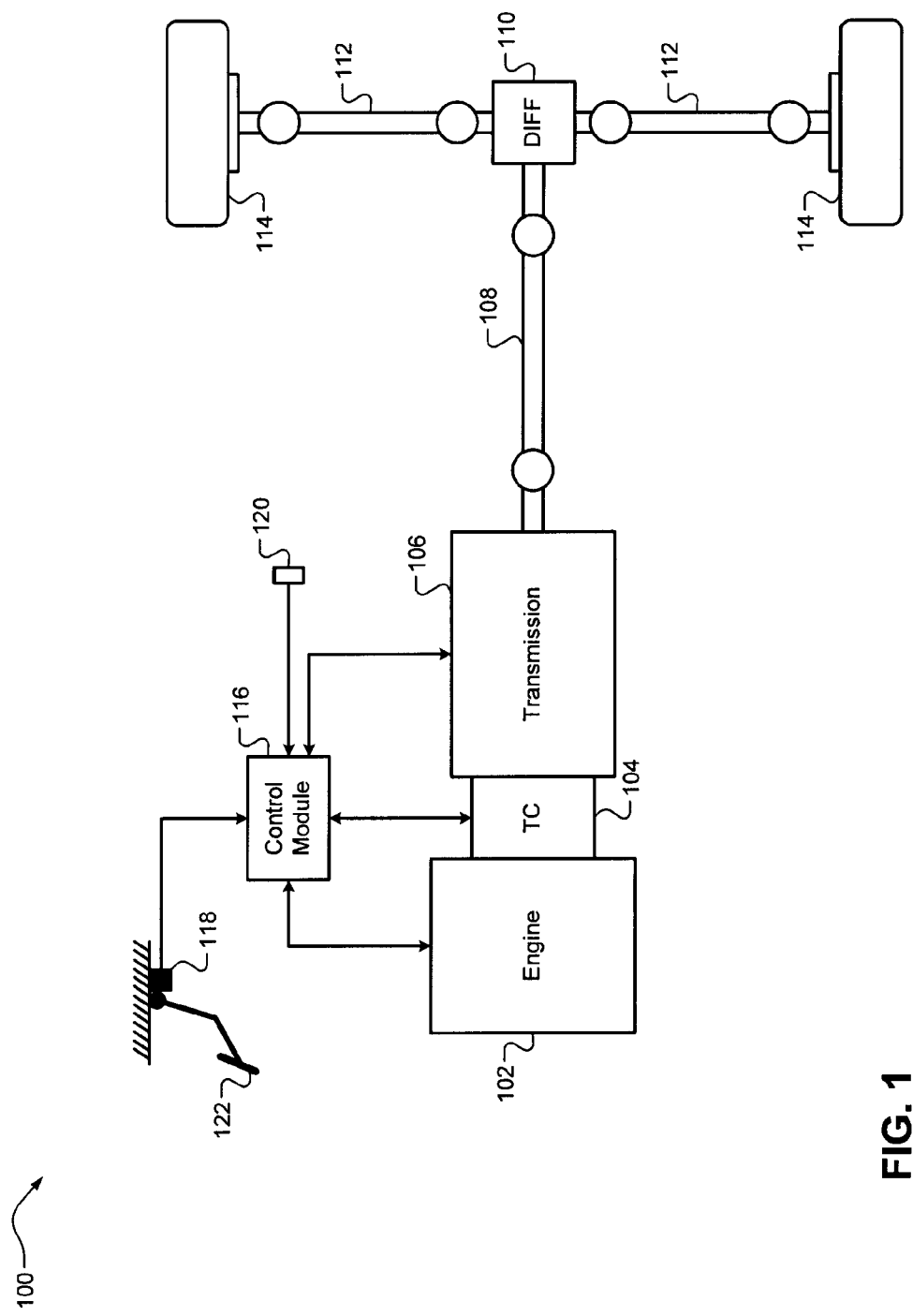
FIG. 1 is a schematic illustration of a vehicle according to the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Typical transmission modeling systems and methods include complex mathematical models that represent dynamic behavior of clutches, hydraulics, and shift controls. This complexity increases computation time and costs. However, transmission modeling systems and methods that ignore the dynamic behavior of the clutches, hydraulics, and shift controls may cause significant torque transients that are unrealistic.

The transmission modeling system and method of the present disclosure determines accelerations during a shift based on approximated clutch torques. More specifically, off-going and on-coming clutch torques are approximated based on an input torque, a shift time (i.e., time elapsed during a shift), and a predetermined relationship between the shift time and a clutch torque percentage (i.e., percentage of clutch engagement). Input and output shaft accelerations are determined based on the off-going and on-coming clutch torques, the input torque, an output torque, a gear ratio, and predetermined inertia. In this manner, shift dynamics are qualitatively determined to prevent unrealistic torque transients without excess computation time and costs.

Referring now to FIG. 1, a vehicle 100 includes an engine 102 that combusts a mixture of air and fuel to produce drive torque. The drive torque is transferred through a torque converter 104 to a transmission 106. The torque transferred from the torque converter 104 to the transmission 106 is an input torque to the transmission 106.

The transmission 106 increases the drive torque transferred to a driveline 108 based on a gear ratio. The torque transferred from the transmission 106 to the driveline 108 is an output torque from the transmission 106. The driveline 108 engages a differential 110 to drive half shafts 112, which rotate wheels 114 to propel the vehicle 100.

A control module 116 controls the engine 102, the torque converter 104, and the transmission 106 based on signals received from an accelerator pedal sensor 118 and a vehicle speed sensor 120. The accelerator pedal sensor provides a signal indicating a pedal position of an accelerator pedal 122. The vehicle speed sensor 120 provides a signal indicating a vehicle speed.

The control module 116 may receive signals from the engine 102, the torque converter 104, and the transmission 106. For example, the control module 116 may receive the input torque to the transmission from the torque converter 104. The control module 116 may determine the output torque from the transmission based on the vehicle speed and a vehicle mass.

The transmission modeling system and method of the present disclosure may simulate the transmission 106 when evaluating other components in the vehicle 100. Alternatively, the transmission modeling system and method of the present disclosure may simulate the transmission 106 when conducting real-time simulations of components in the vehicle 100.

Figure 2:
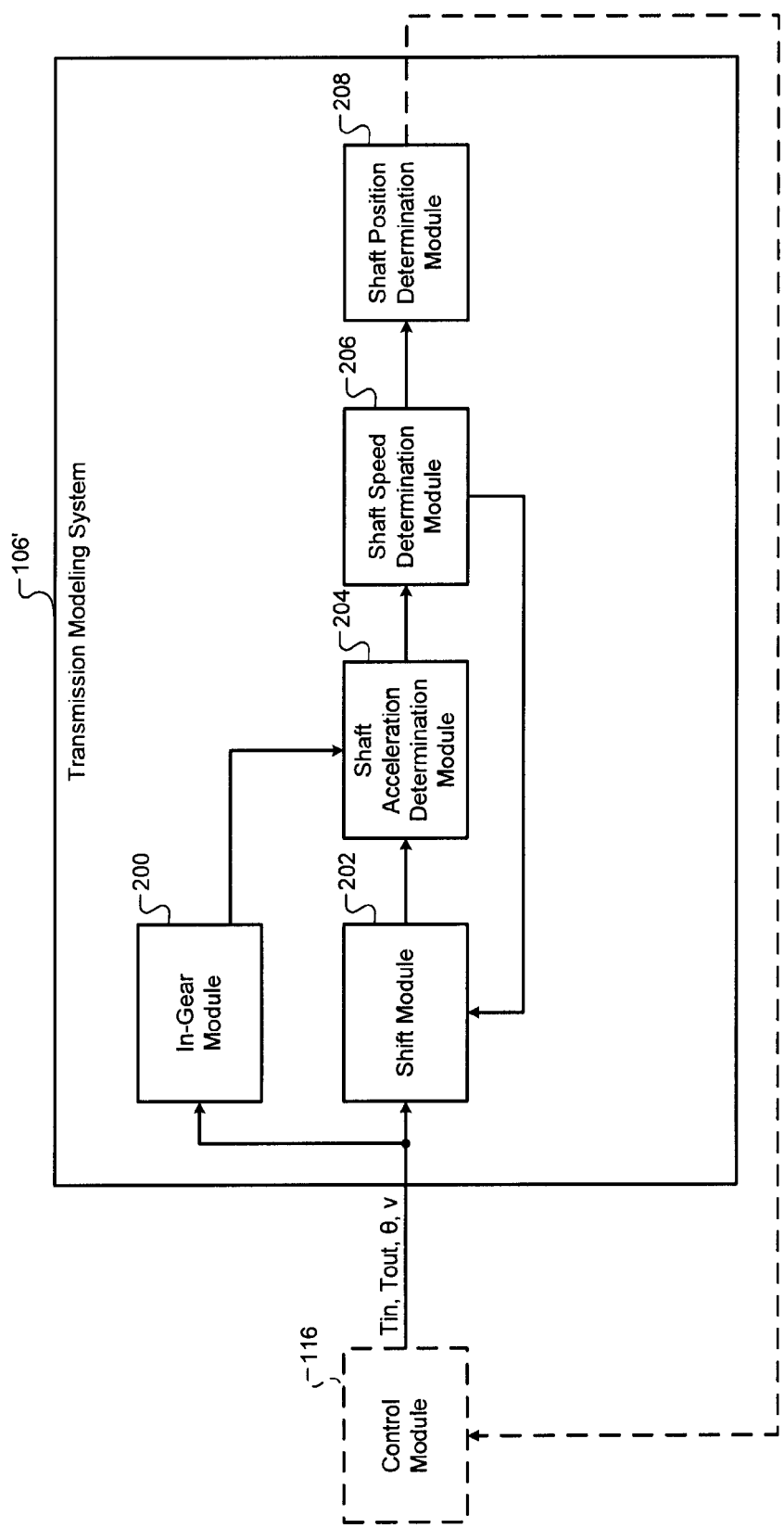
FIG. 2 is a functional block diagram of a transmission modeling system according to the present disclosure.

Referring now to FIG. 2, a functional block diagram of a transmission modeling system 106' that simulates the transmission 106 is shown. The transmission modeling system 106' includes an in-gear module 200, a shift module 202, a shaft acceleration determination module 204, a shaft speed determination module 206, and a shaft position determination module 208. The in-gear module 200 and the shift module 202 may receive the input torque ($T_{in}$), the output torque ($T_{out}$), the pedal position ($\theta$), and the vehicle speed (v) from the control module 116. Alternatively, the in-gear module 200 and the shift module 202 may receive the input torque, the output torque, the pedal position, and the vehicle speed from a simulation module. Further, the control module 120 may include the transmission modeling system 106'.

The in-gear module 200 determines an in-gear acceleration (i.e., transmission angular acceleration when operating in a gear). The in-gear module 200 determines the in-gear acceleration based on the input torque, the output torque, the gear ratio, and a predetermined inertia. The shift module 202 determines a shift acceleration (i.e., transmission angular acceleration when shifting gears). The shift module 202 determines the shift acceleration based on the input torque, the output torque, the pedal position, and the vehicle speed.

The shaft acceleration determination module 204 determines a shaft acceleration (i.e., angular acceleration of a transmission shaft) based on a shift state and the in-gear acceleration from the in-gear module 200 or the shift acceleration from the shift module 202. More specifically, the shaft acceleration determination module 204 sets the shaft acceleration equal to the in-gear acceleration when the shift state indicates in-gear operation, and sets the shaft acceleration equal to the shift acceleration when the shift state indicates shifting.

The shaft speed determination module 206 determines a shaft speed (i.e., angular speed of a transmission shaft) based on the shaft acceleration from the shaft acceleration determination module 204. More specifically, the shaft speed determination module 206 integrates the shaft acceleration to determine the shaft speed. The shaft speed determination module 206 sends the shaft speed to the shift module 202.

The shaft position determination module 208 determines a shaft position (i.e., angular position of a transmission shaft) based on the shaft speed from the shaft speed determination module 206. More specifically, the shaft position determination module 208 integrates the shaft speed to determine the shaft position. The shaft position determination module 208 may send the shaft acceleration, the shaft speed, and the shaft position to the control module 116.

Figure 3:
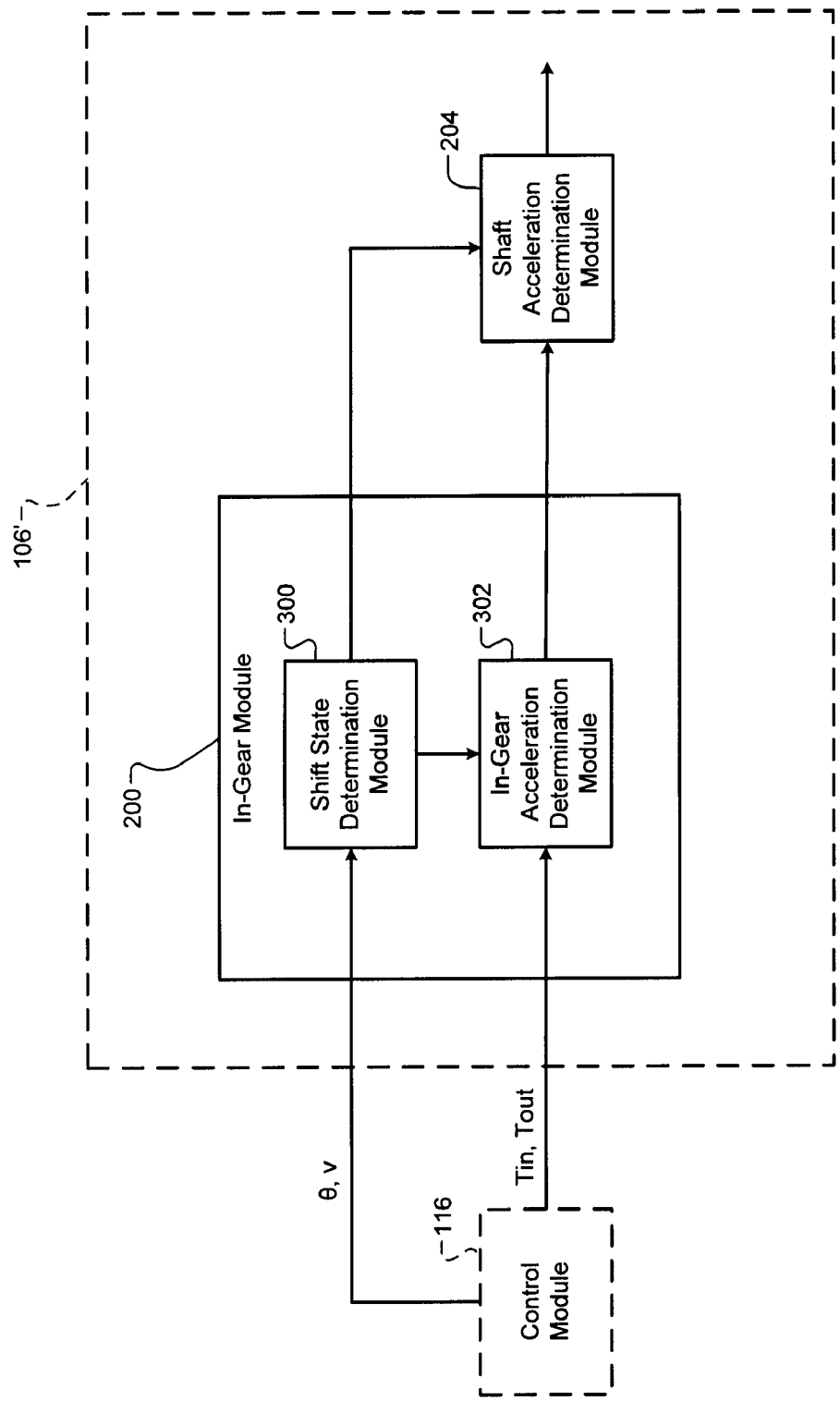
FIG. 3 is a functional block diagram of an in-gear module of the transmission modeling system of FIG. 2 according to the present disclosure.

Referring now to FIG. 3, the in-gear module 200 includes a shift state determination module 300 and an in-gear acceleration determination module 302. The shift state determination module 300 determines the gear ratio and the shift state based on the pedal position, the vehicle speed, and/or a shift schedule. The shift state determination module 300 sends the gear ratio to the in-gear acceleration determination module 302 and sends the shift state to the shaft acceleration determination module 204.

The in-gear acceleration determination module 302 determines the in-gear acceleration, including an in-gear input acceleration and an in-gear output acceleration, and sends the in-gear acceleration to the shaft acceleration determination module 204. The in-gear input acceleration is determined based on the input torque, the output torque, the gear ratio and the predetermined inertia. More specifically, the in-gear input acceleration may be determined using the following single degree-of-freedom equation, where $\alpha_{in}$ is the in-gear input acceleration, $R_{gear}$ is the gear ratio, and $I_{gear}$ is the predetermined inertia for a specific gear.

$$\alpha_{in} = (T_{in} - T_{out}/R_{gear})/I_{gear}$$

The in-gear output acceleration is determined based on the in-gear input acceleration and the gear ratio. More specifically, the in-gear output acceleration may be determined using the following equation.

$$\alpha_{out} = \alpha_{in}/R_{gear}$$

Figure 4:
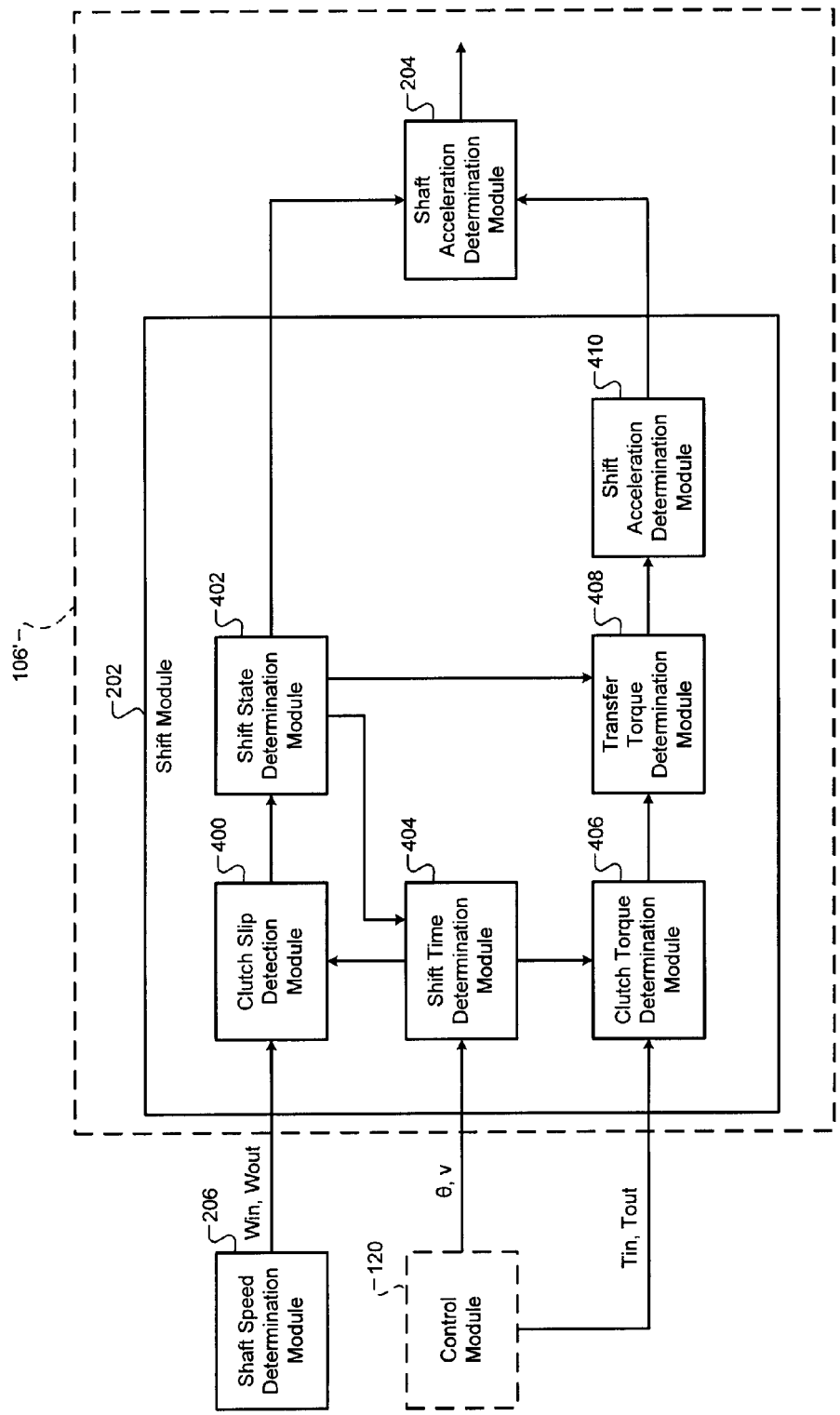
FIG. 4 is a functional block diagram of an shift module of the transmission modeling system of FIG. 2 according to the present disclosure.

Referring now to FIG. 4, the shift module 202 includes a clutch slip detection module 400, a shift state determination module 402, a shift time determination module 404, a clutch torque determination module 406, a transfer torque determination module 408, and a shift acceleration determination module 410. The clutch slip detection module 400 may detect clutch slip based on the shaft speed received from the shaft speed determination module 206. More specifically, the clutch slip detection module 400 may detect clutch slip when a difference between an input shaft speed and an output shaft speed exceeds a slip threshold.

Alternatively, the clutch slip detection module 400 may detect clutch slip based on the shift time received from the shift time determination module 404. More specifically, the clutch slip detection module 400 may detect clutch slip when the shift time exceeds a time threshold.

The shift state determination module 402 determines the gear ratio and the shift state based on pedal position, the vehicle speed, and/or the shift schedule. The shift state determination module 402 sends the gear ratio to the shift time determination module 404 and sends the shift state to the shaft acceleration determination module 204.

The shift time determination module 404 determines the shift time based on the gear ratio received from the shift state determination module 402. More specifically, the shift time determination module 404 may determine the shift time using a timer that initiates when the gear ratio is shifted. The shift time determination module 404 sends the shift time to the clutch slip detection module 400 and the clutch torque determination module 406.

The clutch torque determination module 406 determines the off-going and on-coming clutch torques based on the input torque and the clutch torque percentage. More specifically, the off-going clutch torque may be determined using the following equation, where $T_{off}$ is the off-going clutch torque, $K_{off}$ is an off-going predetermined constant, and $\%_{off}$ is an off-going clutch torque percentage.

$$T_{off} = T_{in} * K_{off} * \%_{off}$$

The on-coming clutch torque may be determined using the following equation, where $T_{on}$ is the on-coming clutch torque, $K_{on}$ is an on-coming predetermined constant, and $\%_{on}$ is an on-coming clutch torque percentage.

$$T_{on} = T_{in} * K_{on} * \%_{on}$$

The predetermined constants may be based on a clutch and gear arrangement. The off-going clutch torque percentage may be determined based on the shift time and a nonlinear relationship between the shift time and the off-going clutch torque percentage. The on-coming clutch torque percentage may be determined based on the shift time and the nonlinear relationship between the shift time and the on-coming clutch torque percentage. The nonlinear relationships between the shift time and the clutch torque percentages may be determined empirically and represented in a reference table.

The transfer torque determination module 408 determines a first transfer torque and a second transfer torque based on the off-going clutch torque, the on-coming clutch torque, the input torque, the output torque, and/or the gear ratio. The relationship between the transfer torques and the off-going clutch torque, the on-coming clutch torque, the input torque, the output torque, and the gear ratio varies based on the clutch and gear arrangement.

The shift acceleration determination module 410 determines the shift acceleration based on the transfer torque and the predetermined inertia. More specifically, shift input and output accelerations may be determined using the following two degree-of-freedom equation, where $a_{in}$ is the shift input acceleration, $a_{out}$ is the shift output acceleration, $T_1$ is the first transfer torque, $T_2$ is the second transfer torque, and $I_{11}$, $I_{12}$, $I_{21}$, and $I_{22}$ are inertia components.

$$\begin{pmatrix} \alpha_{in} \\ \alpha_{out} \end{pmatrix} = \begin{pmatrix} I_{11} & I_{12} \\ I_{21} & I_{22} \end{pmatrix}^{-1} \begin{pmatrix} T_1 \\ T_2 \end{pmatrix}$$

The single degree-of-freedom equation is used to determine the in-gear acceleration since transmission input and output shafts are mechanically coupled during in-gear operation. However, the two degree-of-freedom equation is used to determine the shift acceleration since the transmission input and output shafts are not mechanically coupled during a shift. The shift acceleration determination module 410 sends the shift acceleration to the shaft acceleration determination module 204.

Figure 5:
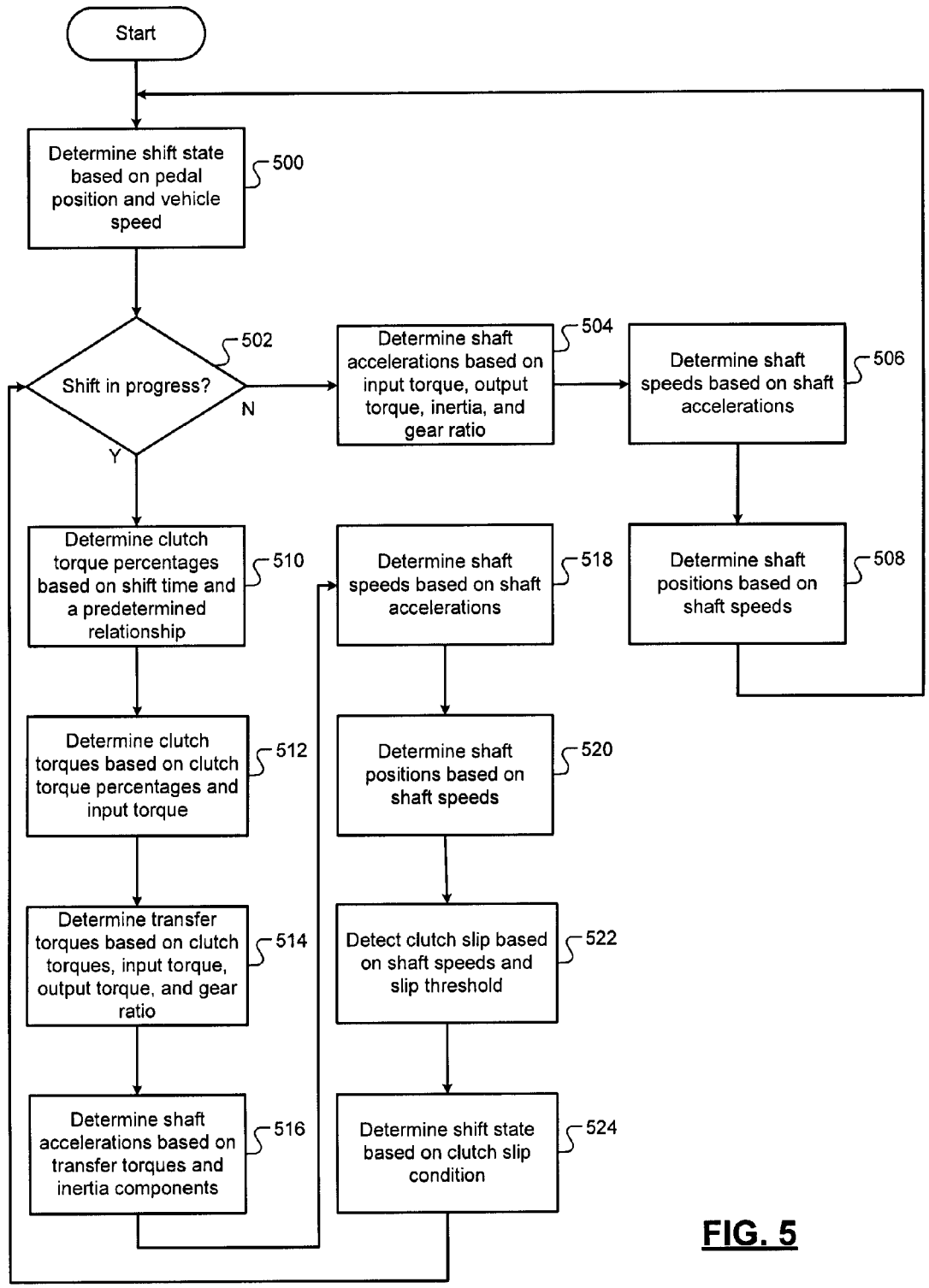
FIG. 5 is a flowchart illustrating exemplary steps of a transmission modeling method according to the present disclosure.

Referring now to FIG. 5, control determines the shift state based on the pedal position and the vehicle speed in step 500. In step 502, control determines whether the shift state indicates a shift is in progress. When the shift state indicates a shift is not in progress, or in-gear operation, control determines the input shaft acceleration and the output shaft acceleration based on the input torque, the output torque, the gear ratio, and the predetermined inertia in step 504.

In step 506, control determines the input shaft speed and the output shaft speed based on the input shaft acceleration and the output shaft acceleration, respectively. In step 508, control determines the input shaft position and the output shaft position based on input shaft speed and the output shaft speed, respectively. Control returns to step 500 when the input shaft position and the output shaft position are determined.

When the shift state indicates a shift is in progress, control determines the off-going and on-coming clutch torque percentages based on the shift time and the predetermined relationships between the shift time and the off-going and on-coming clutch torque percentages in step 510. In step 512, control determines the off-going and on-coming clutch torques based on the input torque, the off-going and oncoming predetermined constants, and the clutch torque percentages.

In step 514, control determines the first and second transfer torques based on the off-going and on-coming clutch torques, the input torque, the output torque, and the gear ratio. In step 516, control determines the input and output shaft accelerations based on the first and second transfer torques and the predetermined inertia components.

In step 518, control determines the input shaft speed and the output shaft speed based on the input shaft acceleration and the output shaft acceleration, respectively. In step 520, control determines the input shaft position and the output shaft position based on input shaft speed and the output shaft speed, respectively.

In step 522, control may detect clutch slip based on the input shaft speed, the output shaft speed, and a slip threshold. More specifically, control may detect clutch slip when a difference between the input shaft speed and the output shaft speed exceeds the slip threshold. Alternatively, control may detect clutch slip when the shift time exceeds the time threshold.

In step 524, control determines the shift state based on whether clutch slip is detected. More specifically, control determines a shift is in progress when clutch slip is detected and determines a shift is not in progress when clutch slip is not detected. Control returns to step 502 when the shift state is determined.

Figure 6:
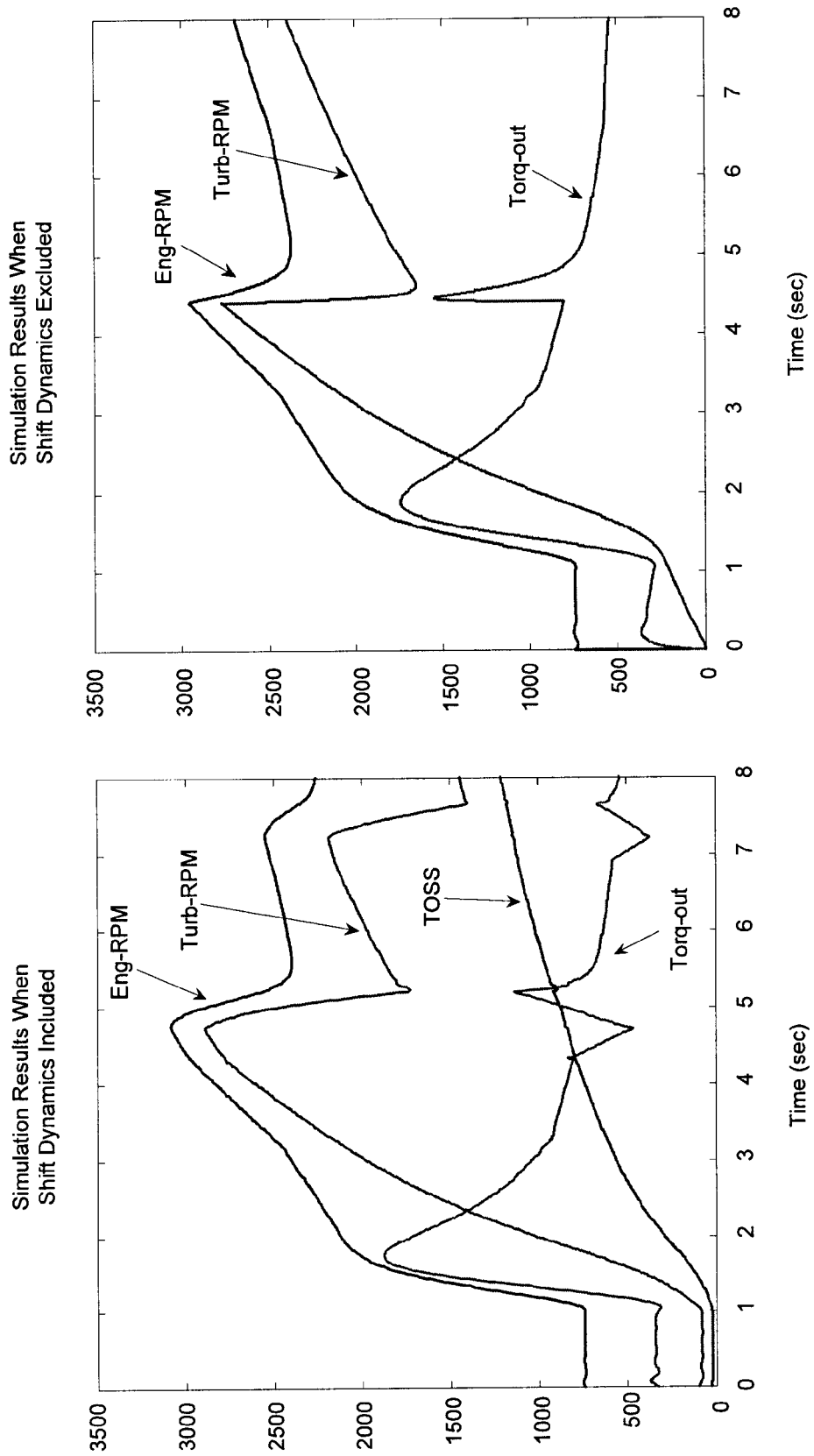
FIG. 6 illustrates simulation results of a transmission modeling system and method according to the present disclosure.

Referring now to FIG. 6, the left graph illustrates simulation results when shift dynamics are included in a transmission model and the right graph illustrates simulation results when the shift dynamics are excluded from the transmission model. The graphs depict an engine speed (Eng-RPM), a turbine speed (Turb-RPM) or the input shaft speed, a transmission output shaft speed (TOSS) or the output shaft speed, and the output torque (Torq-out). The x-axis represents time elapsed in sec, and the y-axis represents rotation speed in RPM and torque in Nm.

In the left graph, a first shift is initiated at approximately 4.5 sec and a second shift is initiated at approximately 7 sec. The first and second shifts each cause a decrease in the output torque when the off-going clutch is disengaged and an increase in the output torque when the on-coming clutch torque is engaged.

In the right graph, a first shift is initiated at approximately 4.5 sec. Since the shift dynamics are excluded, the output torque does not vary based on engagement of the off-going and on-coming clutches. Rather, the first shift causes a transient torque increase as the transmission shifts from a lower gear to a higher gear. This transient torque increase is unrealistic.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A transmission modeling system, comprising:
a transfer torque determination module that determines a transfer torque based on a clutch torque, a transmission input torque, a transmission output torque, and a gear ratio when a vehicle is shifting between gears; and
a shaft acceleration determination module that determines a shaft acceleration based on said transfer torque and a predetermined inertia.

2. The transmission modeling system of claim 1 further comprising:
a shaft speed determination module that determines a shaft speed based on said shaft acceleration; and
a shaft position determination module that determines a shaft position based on said shaft speed.

3. The transmission modeling system of claim 1 wherein said shaft acceleration comprises an input shaft acceleration and an output shaft acceleration.

4. The transmission modeling system of claim 1 further comprising:
a clutch torque determination module that determines said clutch torque based on said transmission input torque and a clutch torque percentage.

5. The transmission modeling system of claim 4 wherein said clutch torque determination module determines said clutch torque percentage based on a shift time.

6. The transmission modeling system of claim 5 further comprising a shift time determination module that determines said shift time based on when said gear ratio is shifted.

7. The transmission modeling system of claim 4 further comprising:
a clutch slip detection module that detects clutch slip based on a transmission input speed, a transmission output speed, and a slip threshold; and
a shift state determination module that determines a shift state based on whether said clutch slip is detected.

8. The transmission modeling system of claim 1 wherein said clutch torque comprises an off-going clutch torque and an on-coming clutch torque.

9. The transmission modeling system of claim 1 wherein said predetermined inertia is for transmission components.

10. The transmission modeling system of claim 1 wherein said transfer torque determination module determines said transfer torque based on a clutch and gear arrangement.

11. A transmission modeling method, comprising:
determining a transfer torque based on a clutch torque, a transmission input torque, a transmission output torque, and a gear ratio when a vehicle is shifting between gears; and
determining a shaft acceleration based on said transfer torque and a predetermined inertia.

12. The transmission modeling method of claim 11 further comprising:
determining a shaft speed based on said shaft acceleration; and
determining a shaft position based on said shaft speed.

13. The transmission modeling method of claim 11 wherein said shaft acceleration comprises an input shaft acceleration and an output shaft acceleration.

14. The transmission modeling method of claim 11 further comprising:
determining said clutch torque based on said transmission input torque and a clutch torque percentage.

15. The transmission modeling method of claim 14 further comprising determining said clutch torque percentage based on a shift time.

16. The transmission modeling method of claim 15 further comprising determining said shift time based on when said gear ratio is shifted.

17. The transmission modeling method of claim 14 further comprising:
detecting clutch slip based on an input speed, an output speed, and a slip threshold; and
determining a shift state based on whether said clutch slip is detected.

18. The transmission modeling method of claim 11 wherein said clutch torque comprises an off-going clutch torque and an on-coming clutch torque.

19. The transmission modeling method of claim 11 wherein said predetermined inertia is for transmission components.

20. The transmission modeling method of claim 11 further comprising determining said transfer torque based on a clutch and gear arrangement.

* * * * *